United States Patent
Ishida et al.

(10) Patent No.: US 9,276,180 B2
(45) Date of Patent: Mar. 1, 2016

(54) METHOD FOR MANUFACTURING LIGHT EMITTING DEVICE AND LIGHT EMITTING DEVICE

(71) Applicant: NICHIA CORPORATION, Ana-shi, Tokushima (JP)

(72) Inventors: Masashi Ishida, Anan (JP); Daisuke Sato, Anan (JP); Tadayuki Kitajima, Itano-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/074,084

(22) Filed: Nov. 7, 2013

(65) Prior Publication Data

US 2014/0131753 A1    May 15, 2014

(30) Foreign Application Priority Data

Nov. 9, 2012 (JP) ................. 2012-247244
Dec. 19, 2012 (JP) ................. 2012-277018
Apr. 23, 2013 (JP) ................. 2013-090508

(51) Int. Cl.
*H01L 33/54* (2010.01)
*H01L 33/60* (2010.01)
(Continued)

(52) U.S. Cl.
CPC ............... *H01L 33/54* (2013.01); *H01L 23/28* (2013.01); *H01L 23/31* (2013.01);
(Continued)

(58) Field of Classification Search
CPC ..... H01L 51/5271; H01L 24/92; H01L 24/94; H01L 25/167; H01L 31/0232; H01L 31/02327; H01L 33/405; H01L 33/483; H01L 23/28; H01L 23/31; H01L 23/3135; H01L 33/48; H01L 33/52; H01L 33/54
USPC .............. 438/26, 27, 28, 29, 33, 38, 106, 108, 438/110, 112, 113, 116, 127; 257/100, 678, 257/680, 723, E23.001, E23.119
See application file for complete search history.

(56) References Cited

U.S. PATENT DOCUMENTS 7,791,014 B2 * 9/2010 Camargo et al. ............. 250/239
2002/0185965 A1 * 12/2002 Collins et al. ................ 313/501
(Continued)

FOREIGN PATENT DOCUMENTS

JP    2009-218274 A    9/2009
JP    2010-219324 A    9/2010
(Continued)

OTHER PUBLICATIONS

US Office Action dated Dec. 21, 2015, for co-pending U.S. Appl. No. 14/815,742.

*Primary Examiner* — Eduardo A Rodela
(74) *Attorney, Agent, or Firm* — Squire Patton Boggs (US) LLP

(57) ABSTRACT

A manufacturing method of a light emitting device includes a light emitting element disposed over a substrate and a reflective resin disposed along the side surface of the light emitting element. The method includes disposing light emitting elements in a matrix over an aggregate substrate, and disposing a semiconductor element between the adjacent light emitting elements in one direction of column and row directions of the light emitting elements in the matrix. A reflective resin is disposed to cover the semiconductor elements along the side surfaces of the light emitting elements and the side surfaces of the phosphor layers. The reflective resin and the substrate disposed in between the adjacent light emitting elements is cut in the column or row direction and between the light emitting element and the adjacent semiconductor element in the other direction, to include a light emitting element or a semiconductor element.

6 Claims, 11 Drawing Sheets

(51) Int. Cl.
*H01L 33/48* (2010.01)
*H01L 33/52* (2010.01)
*H01L 23/28* (2006.01)
*H01L 23/31* (2006.01)
*H01L 25/075* (2006.01)
*H01L 23/00* (2006.01)
*H01L 33/50* (2010.01)

(52) U.S. Cl.
CPC .......... *H01L 23/3135* (2013.01); *H01L 24/97* (2013.01); *H01L 25/0753* (2013.01); *H01L 33/48* (2013.01); *H01L 33/483* (2013.01); *H01L 33/52* (2013.01); *H01L 33/60* (2013.01); *H01L 33/505* (2013.01); *H01L 2224/16225* (2013.01); *H01L 2224/73253* (2013.01); *H01L 2924/12041* (2013.01)

(56) References Cited

U.S. PATENT DOCUMENTS

| | | | |
|---|---|---|---|
| 2012/0025218 A1* | 2/2012 | Ito et al. | 257/88 |
| 2012/0236582 A1* | 9/2012 | Waragaya et al. | 362/510 |
| 2013/0193458 A1 | 8/2013 | Mochizuki | |
| 2013/0334558 A1* | 12/2013 | Pindl et al. | 257/98 |
| 2014/0091348 A1* | 4/2014 | Katayama et al. | 257/98 |

FOREIGN PATENT DOCUMENTS

| | | |
|---|---|---|
| JP | 2010-238846 A | 10/2010 |
| JP | 2011-066193 A | 3/2011 |
| JP | 2012-124443 A | 6/2012 |

* cited by examiner

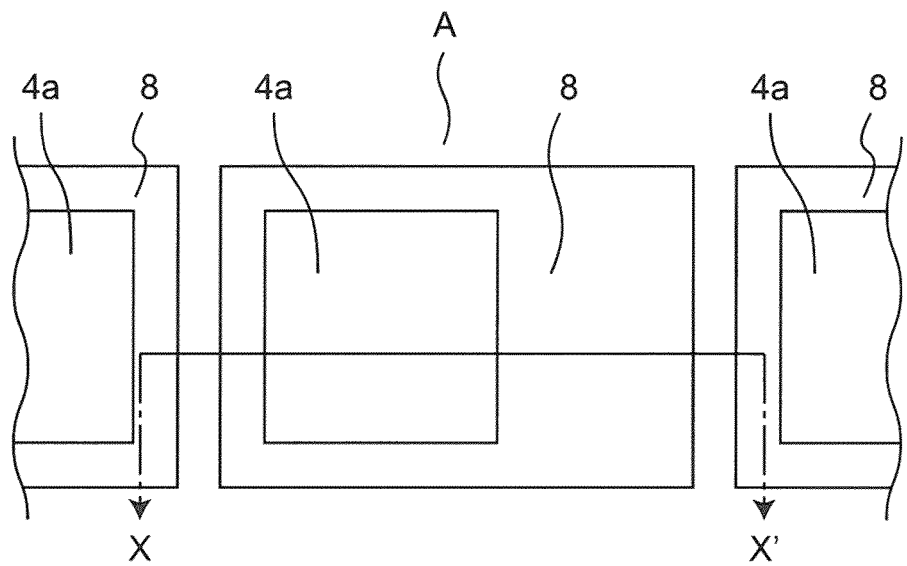
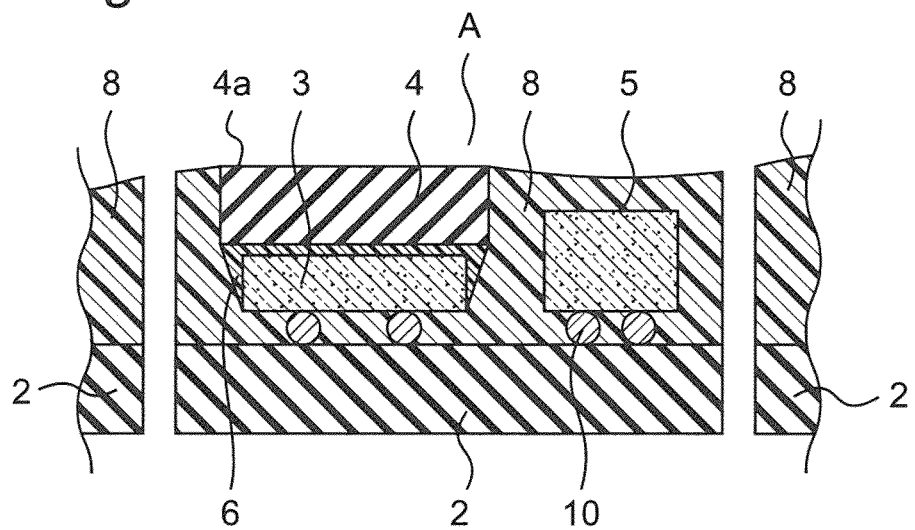

METHOD FOR MANUFACTURING LIGHT EMITTING DEVICE AND LIGHT EMITTING DEVICE

BACKGROUND OF THE INVENTION

1. Field of the Invention

The present invention relates to a method for manufacturing a light emitting device that can be used for a display device, an illumination tool, a display, a backlight source of a liquid crystal display, and the like, and a light emitting device manufactured using the same.

2. Description of Related Art

Light emitting diodes (LED) having received attention as a next-generation light source have excellent effect of energy saving as compared to an existing light source, and will be able to be semipermanently used. Applications of the light emitting diode, for example, including a backlight, a vehicle, a lighting board, a traffic light, and a general illuminating light, have been spread industry-wide.

One of the well-known light emitting devices using the LED includes a light emitting element mounted on a mounting substrate with wirings. In recent years, the so-called chip scale package (CSP), that is, a package having substantially the same size as a light emitting element, and a planar light emitting device including light emitting elements mounted at a high density have been developed.

By way of such a light emitting device, in order to ensure a high front surface brightness, the light emitting device is proposed which includes a light emitting element, a wavelength conversion layer disposed over the light emitting element for converting a wavelength of the light from the light emitting element, the conversion layer being formed of a translucent member including a phosphor, and a reflection member disposed adjacent to the side surface of the wavelength conversion layer and the side surface of the light emitting element (for example, JP 2009-218274 A).

FIG. 11 is an exemplary diagram of an example of one step of a manufacturing method of a light emitting device in the related art, showing a plurality of light emitting devices manufactured. A plurality of light emitting elements 53 are flip-chip mounted over a substrate 52 via bumps 60. A phosphor layer 54 forming a light emitting surface of the light emitting device is bonded to the upper surface of each light emitting element 53 using a phosphor layer adhesive 56. The light emitting element 53 and the phosphor layer 54 are sealed with a reflective resin 58.

However, in an intermediate region 61 between the adjacent light emitting elements 53, a recessed portion, which is the so-called "sink", is generated due to hardening and contraction of the reflective resin 58. In particular, the largest intermediate region 61, that is, a region having the maximum distance between the adjacent light emitting elements 53 tends to generate the sink. As the sink becomes larger, the width of the reflective layer on each side surface of the phosphor layer 54 is thinned, which cannot sufficiently reflect the light from the phosphor layer 54, resulting in a decrease in light-extraction efficiency. This might make the light emitted from a light emitting surface non-uniform, or render an end of the light emitting surface vague, thus leading to degradation of light quality.

SUMMARY OF THE INVENTION

Accordingly, it is an object of the present invention to provide a method for manufacturing a light emitting device, and a light emitting device manufactured by the method that can improve the light-extraction efficiency by suppressing the sink of the reflective resin and increasing the thickness of the reflective layer on the side surface of the phosphor layer.

In order to solve the above problems, the inventors have intensively studied and found that a semiconductor element can be disposed between the adjacent light emitting elements to suppress the sink of the reflective resin. Based on the findings, the present invention has been made.

That is, a method for manufacturing a light emitting device according to one embodiment of the invention is a manufacturing method of a light emitting device which includes a light emitting element disposed over a substrate and a reflective resin disposed along the side surface of the light emitting element. The method includes the steps of: disposing light emitting elements in a matrix over an aggregate substrate, and disposing a semiconductor element between the adjacent light emitting elements in one of column and row directions of the light emitting elements in the matrix; after disposing phosphor layers over the respective upper surfaces of the light emitting elements, disposing a reflective resin along the side surfaces of the light emitting elements and the side surfaces of the phosphor layers to cover the semiconductor elements; and simultaneously cutting the reflective resin and the substrate disposed in between the adjacent light emitting elements in one direction of the column and row directions and between the light emitting element and the semiconductor element adjacent thereto in the other direction so as to include at least one light emitting element and one semiconductor element.

That is, a method for manufacturing a light emitting device according to another embodiment of the invention is a manufacturing method of a light emitting device which includes a light emitting element disposed over a substrate and a reflective resin disposed along the side surface of the light emitting element. The method includes the steps of: disposing a plurality of light emitting elements in a matrix over an aggregate substrate, and disposing a semiconductor element other than the light emitting element in between the adjacent light emitting elements in one of column and row directions of the light emitting elements disposed in the matrix; disposing translucent members each having a phosphor layer previously formed on a front surface thereof, over the respective light emitting elements with the phosphor layer facing the upper surface of the light emitting element; disposing a reflective resin along the side surfaces of the light emitting elements, side surfaces of the phosphor layers, and the translucent members to cover the semiconductor elements; and simultaneously cutting the reflective resin and the substrate disposed in between the adjacent light emitting elements in one of the column and row directions and between the light emitting element and the adjacent semiconductor element in the other direction so as to include at least one light emitting element and one semiconductor element.

A light emitting device according to a further embodiment of the invention includes a light emitting element disposed over a substrate; a phosphor layer disposed over the light emitting element; a semiconductor element disposed adjacent to the light emitting element; and a reflective resin disposed along the side surfaces of the light emitting element and the phosphor layer to cover the semiconductor element. A corner formed by a side surface of the reflective resin on the semiconductor element side and an upper surface of the reflective resin forms an acute angle in a vertical cross-sectional view including the light emitting element and the semiconductor element.

Accordingly, the invention can provide a light emitting device with improved light-extraction efficiency by increas-

BRIEF DESCRIPTION OF THE DRAWINGS

FIG. 3A is an exemplary top view showing an example of a light emitting device manufactured using the manufacturing method according to the first embodiment of the invention.

FIG. 3B is a schematic cross-sectional view showing the example of the light emitting device manufactured using the manufacturing method in the first embodiment of the invention.

DETAILED DESCRIPTION OF THE EMBODIMENTS

Preferred embodiments of the present invention will be described below with reference to the accompanying drawings. The terms "upper" and "lower" as used in the present application are used to indicate the side from which light emitted from a light emitting device is extracted, and the opposite side thereto. For example, the term "upward" as used herein means the direction in which the light emitted from the light emitting device is extracted, and the term "downward" as used herein means the opposite direction thereto. The term "upper surface" as used herein means a surface on the side from where the light emitted from the light emitting device is extracted, and the term "lower surface" as used herein means the opposite surface thereto.

First Embodiment

A method for manufacturing a light emitting device according to this embodiment includes the steps of: disposing a plurality of light emitting elements in a matrix over an aggregate substrate, and disposing a semiconductor element other than the light emitting element in between the adjacent light emitting elements in one of column and row directions of the light emitting elements disposed in the matrix; after disposing phosphor layers over the upper surface of the light emitting elements, disposing a reflective resin to cover the semiconductor elements along the side surfaces of the light emitting elements and the side surfaces of the phosphor layers; and simultaneously cutting the reflective resin and the substrate disposed in between the adjacent light emitting elements in one direction of the column and row directions and between the light emitting element and the adjacent semiconductor element in the other direction so as to include at least one light emitting element and one semiconductor element.

Figure 1A:
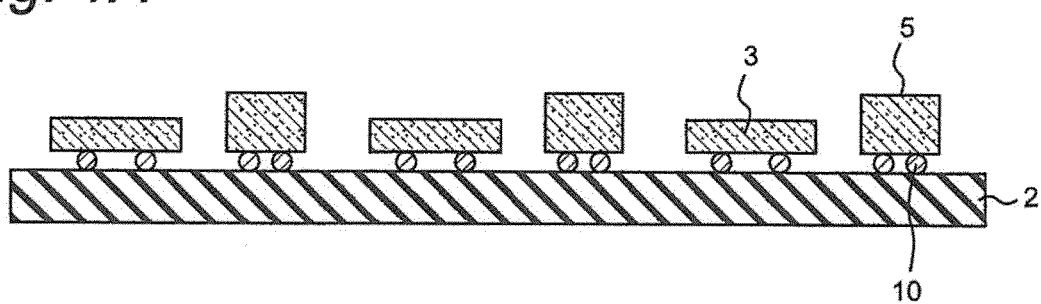
FIG. 1A is a schematic cross-sectional view showing an example of one step in a manufacturing method according to a first embodiment of the invention.
Figure 1B:
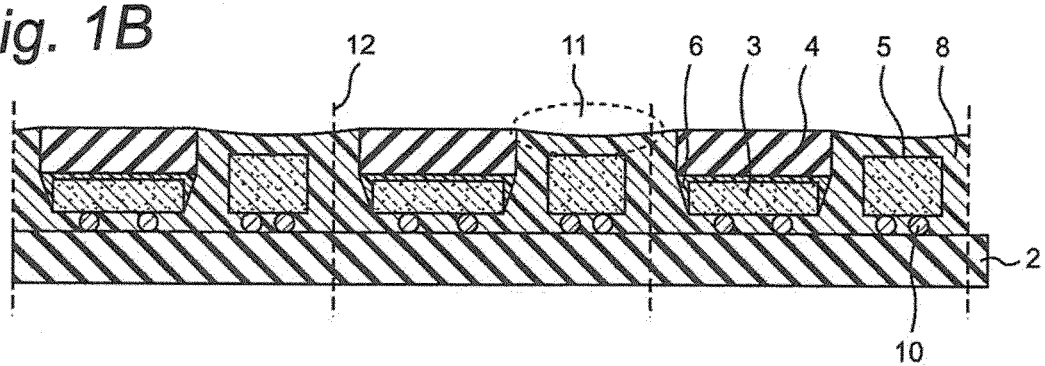
FIG. 1B is a schematic cross-sectional view showing an example of another step in the manufacturing method in the first embodiment of the invention.

FIGS. 1A and 1B show exemplary diagrams of an example of steps in the manufacturing method of a light emitting device in this embodiment. Referring to FIG. 1A, a plurality of light emitting elements are arranged in a matrix over an aggregate substrate, and a semiconductor element is disposed between the adjacent light emitting elements in one direction of the column and row directions of the light emitting elements disposed in the matrix. Methods for arranging the light emitting elements and the semiconductor elements for use can include flip-chip mounting. Conductive patterns including a positive electrode and a negative electrode insulated from each other are formed over the substrate 2. The flip chip mounting is a mounting method for mechanically and electrically coupling the light emitting elements to the conducive patterns of a base substrate by bonding and opposing the electrodes of the light emitting elements to the conductive patterns via conductive members, such as bumps. In mounting, the bump may be provided on the substrate, or on the light emitting element and semiconductor element.

Then, p and n electrodes (not shown) of a light emitting element 3 are respectively opposed to both the positive and negative electrodes (not shown) formed on the same surface of the substrate 2 and fixed to the electrodes via conductive members 10. The respective electrodes of the light emitting element 3 are opposed to the conductive members 10 by applying heat, ultrasound wave, and loads, so that the light emitting elements 3 are bonded to the conductive members 10.

In a step shown in FIG. 1B, after disposing phosphor layers over the respective upper surfaces of the light emitting elements, a reflective resin is disposed along the side surfaces of the light emitting elements and the side surfaces of the phosphor layers to cover the semiconductor elements. A reflective resin 8 is to reflect the light emitted from the light emitting elements 3. The reflective resin 8 is disposed over the side surfaces of the light emitting elements 3 and over the side surfaces of phosphor layers 4 to thereby cover the entire semiconductor elements 5. The semiconductor element 5 is disposed in an intermediate region 11 between the adjacent light emitting elements 3, thereby suppressing the sink of the reflective resin 8. As a result, the width of the reflective layer on each side surface of the phosphor layer 4 becomes thicker, which can sufficiently reflect the light from the phosphoric layer 4, thus improving the light-extraction efficiency. Underfill material (not shown) may be charged into gaps between the light emitting element 3 and semiconductor element 5, and the conductive member 10.

Figure 2:
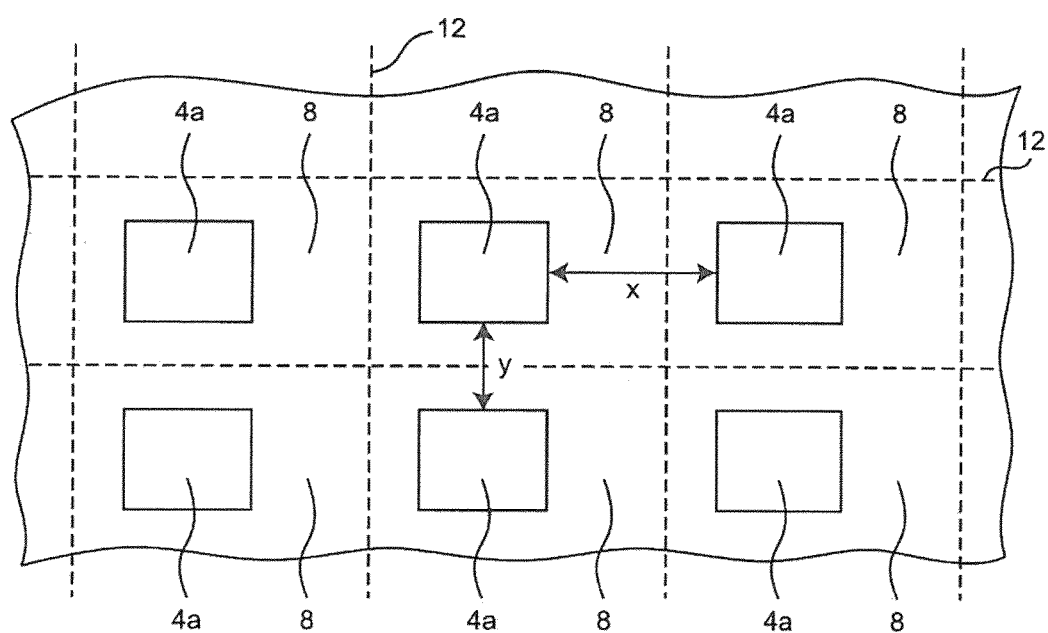
FIG. 2 is an exemplary top view showing an example of another step in the manufacturing method in the first embodiment of the invention.

Then, in a next step (not shown), the reflective resin and the substrate are simultaneously cut along a cutting line 12 shown in FIG. 1B and FIG. 2 between the adjacent light emitting elements in one direction of the column and row directions and between the light emitting element and the adjacent semiconductor element in the other direction to include at least one light emitting element and one semiconductor element, so that individual light emitting devices are separated from a group of light emitting devices.

In this way, the light emitting device can be manufactured which has improved light-extraction efficiency by suppressing the sink of the reflective resin.

(Substrate)

Suitable materials for the substrate are preferably insulating materials, specifically, materials which are less likely to allow light from the light emitting element or external light to pass through the material. For example, the suitable materials for the substrate can include ceramic, such as alumina or aluminum nitride, resin, such as phenol resin, epoxy resin, polyimide resin, BT resin, or polyphthalamide, and the like. In use of the resin, if necessary, inorganic filler, such as glass fiber, silicon oxide, titanium oxide, or alumina, can be mixed into the resin. This mixture can improve the mechanical strength and the light reflectivity, and reduce the thermal expansion rate.

(Light Emitting Element)

The light emitting element 3 is preferably a light emitting diode, and can select an arbitrary wavelength according to application. For example, the light emitting element 3 can preferably include a nitride semiconductor ($In_xAl_yGa_{1-x-y}N$, $0 \leq x$, $0 \leq Y$, $X+Y \leq 1$) that can emit light having a short wavelength that enables the effective excitation of phosphor material. Various wavelengths of the light to be emitted can be selected according to the material or the mixed crystal degree of the semiconductor layer.

(Phosphor Layer)

The phosphor layer 4 absorbs at least a part of light emitted from the light emitting element 3 to generate light having a different wavelength. The phosphor layer can include, for example, a piece cut from a phosphor ingot made of phosphor single crystal, or polycrystal, or a sintered body of phosphor powder, or a piece molded using a mixture of the phosphor material and a translucent material made of resin, glass, or inorganic material. The phosphor layer may be formed in a single layer of one kind of material or two or more kinds of materials, or may be formed of a laminated layer with two or more layers. The phosphor layer may be a translucent member made of glass or resin with a phosphor layer formed on its front surface. A diffusing agent may be added to the phosphor layer if necessary.

In the invention, in order to suppress the sink of the reflective resin, it is necessary to heighten the upper surface of the reflective resin by completely embedding the semiconductor elements in the reflective resin. For this reason, the upper surface (light emitting surface) of the phosphor layer needs to be at a higher level than the upper surface of the semiconductor element.

Typical phosphor materials that can emit a white mixed-colored light beam in combination with the use of a blue light emitting element can include, for example, an yttrium aluminum garnet phosphor (YAG phosphor). When setting the light emitting device that can emit white light, the concentration of phosphor materials contained in the phosphor layer is adjusted so as to emit the white light. The concentration of the phosphor materials is in a range of, for example, about 5 to 50%.

Alternatively, a blue light emitting element is used as the light emitting element, and a combination of a YAG phosphor and a nitride phosphor containing a predominant amount of a red component is used as the phosphor member, which can emit umber light. The umber color corresponds to a region comprised of a long-wavelength region of yellow defined by JIS Z8110 and a short-wavelength region of yellow-red, or a chromaticity range sandwiched between a range of yellow as a safe color defined by JIS Z9101 and the short-wavelength range of yellow-red. The umber color corresponds to a region positioned at a dominant wavelength of 580 to 600 nm.

The YAG phosphor is a general name for a garnet structure containing Y and Al. The YAG phosphor is a phosphor activated by at least one element selected from rare-earth elements, and serves to emit the light by being excited by a blue light beam emitted from the light emitting element. The YAG phosphor can include, for example, $(Re_{1-x}Sm_x)_3(Al_{1-y}Ga_y)_5O_{12}$:Ce ($0 \leq x < 1$, $0 \leq y \leq 1$, in which Re is at least one element selected from the group consisting of Y, Gd, and La).

The nitride phosphor is a phosphor containing N, at least one group IV element selected from the group consisting of C, Si, Ge, Sn, Ti, Zr, and Hf, and at least one group II element selected from the group consisting of Be, Mg, Ca, Sr, Ba, and Zr, which is activated by at least one rare earth element selected from the group consisting of Y, La, Ce, Pr, Nd, Sm, Eu, Gd, Tb, Dy, Ho, Er, and Lu. The composition of the nitride phosphor may contain O.

Specifically, the nitride phosphor can be represented by a general formula $L_xM_yN_{((2/3)x+(3/4)Y)}$:R, or $L_xM_yO_zN_{((2/3)x+(4/3)Y-(2/3)Z)}$:R (in which L is at least one group II element selected from the group consisting of Be, Mg, Ca, Sr, Ba, and Zn; M is at least one group IV element selected from the group consisting of C, Si, Ge, Sn, Ti, Zn, and Hf; and R is at least one rare-earth element selected from the group consisting of Y, La, Ce, Pr, Nd, Sm, Eu, Gd, Tb, Dy, Ho, Er, and Lu. X, Y, and Z satisfy the following relations: $0.5 \leq X \leq 3$, $1.5 \leq Y \leq 8$, $0 < Z \leq 3$).

(Semiconductor Element)

The semiconductor elements 5 are disposed adjacent to the light emitting elements 3 over the substrate 2, separately from the light emitting element 3. Any member that can heighten the upper surface of the reflective resin 8 up to the upper surface of the phosphor layer 4 can be used in place of the semiconductor element, but the semiconductor element can be normally used. Such semiconductor elements can include another light emitting element not intended for light emission of the light emitting device, a transistor for controlling the light emitting element, and a protective element to be described below. The protective element is an element for protecting the light emitting element 3 against element breakdown or performance degradation due to excessive applied voltage. The protective element is specifically comprised of a Zener diode which is designed to be energized when a predetermined voltage or more is applied thereto. The protective element is a semiconductor element having p and n electrodes, like the light emitting element 3, and is arranged in antiparallel to p and n electrodes of the light emitting element 3. That is, the n and p electrodes of the light emitting element 3 are electrically connected to the p and n electrodes of the protective element via the conductive member 10. Like the light emitting element, the respective electrodes of the protective element are opposed to over the conductive members by applying heat, ultrasound wave, and loads, like the light emitting element, so that the protective elements are bonded to the conductive members.

Thus, even when an excessive voltage is applied to between both p and n electrodes of the light emitting element 3 and intends to exceed a Zener voltage of the Zener diode, the voltage between both p and n electrodes of the light emitting element 3 is kept to the Zener voltage, and never exceed the Zener voltage. The provision of the protective element can prevent the voltage between both p and n electrodes from reaching the Zener voltage or more, and thus can appropriately prevent the element breakdown and performance degradation of the light emitting element 3 due to the excessive applied voltage.

The height of the semiconductor element in mounting needs to be lower than that of the combination of the light emitting element and the phosphor layer. This is because the semiconductor element is completely embedded in the reflective resin to increase the upper surface of the reflective resin, thereby suppressing the sink of the resin.

FIG. 2 is a top view of the group of the light emitting devices disposed over the aggregate substrate in the step of FIG. 1B. Referring to FIG. 2, the upper surfaces 4a of the phosphor layers are arranged in the column and row directions over the substrate. The upper surface 4a forms the light emitting surface of each of the light emitting devices. The semiconductor elements are completely embedded in the reflective resin, and thus cannot be observed. However, an intermediate region is disposed between the adjacent two light emitting elements in the row direction. Preferably, the intermediate region for disposing the semiconductor element therein is an intermediate region disposed between the light emitting element and another adjacent light emitting element having a larger one of a distance between the adjacent light emitting elements in one direction of the column and row directions and a distance between the adjacent light emitting elements in the other direction. This is because the sink of the reflective resin tends to be generated in the intermediate region. Referring to FIG. 2, a distance X in the row direction is larger than a distance y in the column direction. In this case, the semiconductor element is disposed in the intermediate region in the row direction. Within a region surrounding the light emitting element defined by the cutting line 12 of FIG. 2, the area of a surrounding region except for a region where the semiconductor element is disposed should be as small as possible because this arrangement can suppress the sink of the reflective resin in the surrounding region.

(Reflective Resin)

Suitable material for the reflective resin 8 for use is preferably insulating material. In order to ensure adequate strength, for example, a thermosetting resin or thermoplastic resin can be used. More specifically, the resins can include phenol resin, epoxy resin, BT resin, PPA, and silicon rein. Powder made of reflective material (for example, $TiO_2$, $Al_2O_3$, $ZrO_2$, $MgO$) having its refractive index largely different from that of resin as a base and which is less likely to absorb light from the light emitting element 3 is dispersed into the resin as the base, which can effectively reflect the light.

The reflective resin 8 can be charged, for example, by use of a resin discharge device that can be moved (operated) over the fixed substrate 2 vertically or horizontally with respect to the substrate 2. That is, the resin discharge device with the resin charged therein is moved while discharging a liquid resin from a nozzle at a tip of the device, whereby the reflective resin 8 is charged into the vicinity of the light emitting element 3 and the semiconductor element 5. The moving velocity of the resin discharge device can be appropriately adjusted according to the viscosity and temperature of the resin used. Adjustment of the discharge amount can be performed by setting a pressure or the like at the time of discharge to a certain level, or the like. The viscosity of the reflective resin at room temperature (20±5° C.) is in a range of 0.35 to 13.0 Pa·s, and preferably in a range of 3.0 to 5.5 Pa·s.

(Conductive Member)

A conductive member for use can be bumps. Suitable materials for the bumps can include, Au, eutectic solder (Au—Sn), Pb—Sn, lead-free solder, and the like. Although FIGS. 1A and 1B show an example of use of the bumps as the conductive member, the conductive member is not limited to the bump, and for example, may be a conductive paste.

(Underfill Material)

The underfill material is a member for protecting the light emitting element, other semiconductor elements, and the conductive members disposed over the substrate against refuse, moisture, external force, and the like. The underfill material may be charged into gaps between the light emitting element 3 and semiconductor element 5, and the conductive member 10 and the substrate 2 if necessary.

Suitable underfill materials can include, for example, silicone resin, epoxy resin, urea resin, and the like. In addition to such a material, the underfill material can contain a colorant, a light diffusing agent, a filler, a phosphor material, and the like if necessary.

Figure 4:
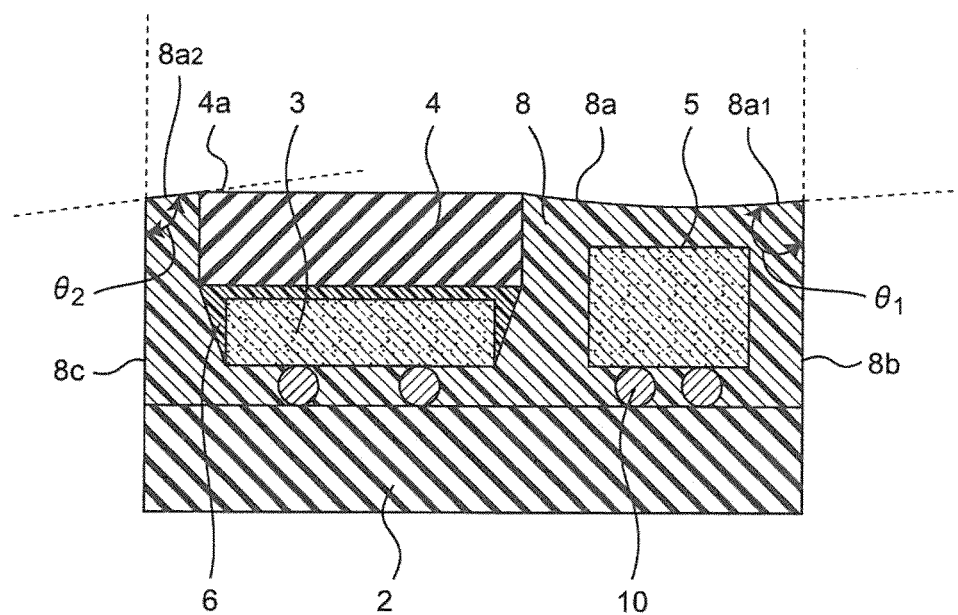
FIG. 4 is an enlarged view of FIG. 3B.

FIGS. 3A and 3B are exemplary diagrams showing one example of the structure of the light emitting device A manufactured using the manufacturing method of a light emitting device in this embodiment, while illustrating the state of the light emitting element and the semiconductor element directly after cutting vertically. FIG. 3A is a top view thereof, and FIG. 3B is a cross-sectional view taken along line X-X' of FIG. 3A. The light emitting surface 4a is formed of a part of the phosphor layer. The reflective resin layer 8 is provided in the light emitting device. The light emitting device 1 includes the substrate 2, the light emitting elements 3 flip-chip mounted over the substrate 2 via the conductive members 10, each light emitting element having the phosphor layer 4 over its upper surface, the semiconductor elements 5 flip-chip mounted over the substrate 2 via the conductive members 10, each semiconductor element being arranged in parallel to the light emitting element 3, and the reflective resin 8 disposed along the side surfaces of the light emitting elements 3 and the phosphor layers 4 to cover the entire semiconductor elements 5. As shown in FIGS. 3A and 3B, one of the light emitting devices continuously arranged in rows is cut from an adjacent light emitting device in a continuous region therebetween in the row direction. FIG. 4 is an enlarged view of the exemplary cross-sectional view of FIG. 3B. The reflective resin 8 has an upper surface 8a, a side surface 8b on the semiconductor element 5 side surface, and a side surface 8c on the light emitting element 3 side surface. An angle $\theta_1$ indicates an angle of a corner 8a1 on the semiconductor element 5 side surface formed by the side surface 8b of the reflective resin 8 on the semiconductor element 5 side surface and the upper surface 8a of the reflective film 8. The corner 8a1 forms an acute angle in the vertical cross-sectional view including the light emitting element 3 and the semiconductor element 5. Since the angle $\theta_1$ is the acute angle, the thickness of the reflective resin 8 covering the semiconductor element 5 can be sufficiently ensured. In contrast, when the angle $\theta_1$ is an obtuse angle, the reflective resin 8 covering the semiconductor element 5 is thinned, so that the reflective resin might disadvantageously reduce the function of protecting the semiconductor element 5 from external environment. On the other hand, an angle $\theta_2$ indicates an angle of a corner 8a2 on the light emitting element 3 side surface formed by the side surface 8c of the reflective resin 8 on the light emitting element 3 side surface and the upper surface 8a of the reflective film 8. The corner 8a2 forms the obtuse angle in the vertical cross-sectional view including the light emitting element and the semiconductor element. As shown in FIG. 3B, in the cutting step of the manufacturing method of the light emitting device, when the angle $\theta_2$ is the obtuse angle, then the angle $\theta_1$ at the side surface 8b of the reflective resin 8 of another adjacent light emitting device becomes the acute angle, which is preferable. Further, a deepest part of a recessed portion (sink) formed at the upper surface of the reflective resin is preferably formed directly above the semiconductor element. This is because, when the deepest part of the recessed portion is not located directly above the semiconductor element, the reflective layer on the side surface of the phosphor layer 4 becomes thin, which is not preferable. The deepest part is preferably formed directly above the center of the upper surface of the semiconductor element. This arrangement can suppress the thickness of the reflective layer on the side surface of the phosphor layer from being decreased, while ensuring the thickness of the reflective resin for protecting the semiconductor element.

The light emitting device 1 includes the thick reflective layer on the side surface of the phosphor layer 4 with little sink of the reflective resin 8, which can sufficiently reflect the light from the phosphor layer 4. As a result, the light emitting device 1 can improve the light-extraction efficiency.

Second Embodiment

The phosphor layer for use is produced by molding a mixture of the phosphor material and binder, such as resin or glass, into a plate shape. In order to adjust the light emission from the light emitting device to a desired chromaticity, it is often necessary to increase the amount of phosphor material contained in the phosphor layer. Methods for increasing the amount of phosphor material include increasing the concentration of phosphor material, and increasing the thickness of the phosphor layer. As the concentration of some phosphor materials selected is increased, the phosphor layers made of the phosphor material might have its strength reduced. When the thickness of the phosphor layer is increased, the thermal conductivity of the phosphor layer is reduced. As a result, heat generated by the phosphor in the light conversion is stored in the phosphor layer, which might promote thermal degradation of the phosphor or binder, thereby reducing the intensity of fluorescence. However, this embodiment can decrease the thickness of the phosphor layer to increase the concentration of the phosphor, in addition to the effect of the first embodiment.

A method for manufacturing a light emitting device according to this embodiment includes the steps of: disposing a plurality of light emitting elements in a matrix over an aggregate substrate, and disposing a semiconductor element other than the light emitting element in between the adjacent light emitting elements in one of column and row directions of the light emitting elements in the matrix; disposing translucent members each having a phosphor layer previously formed over a front surface thereof, over the respective light emitting elements with the phosphor layer facing the corresponding upper surface of the light emitting element; disposing a reflective resin along the side surfaces of the light emitting elements, the side surfaces of the phosphor layers, and the translucent members to cover the semiconductor elements; and simultaneously cutting the reflective resin and the substrate in between the adjacent light emitting elements in one of the column and row directions and between the light emitting element and the adjacent semiconductor element in the other direction so as to include at least one light emitting element and one semiconductor element.

Figure 5A:
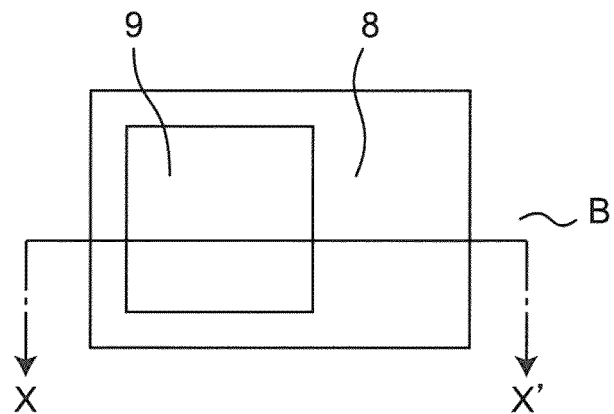
FIG. 5A is an exemplary top view showing an example of a light emitting device according to a second embodiment of the invention.
Figure 5B:
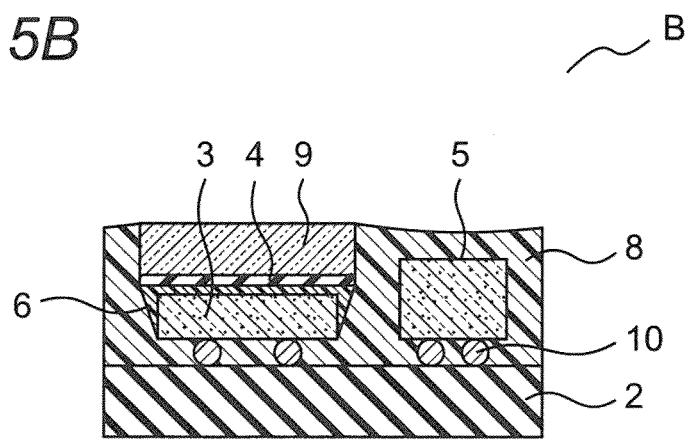
FIG. 5B is a schematic cross-sectional view showing the example of the light emitting device in the second embodiment of the invention.
Figure 5C:
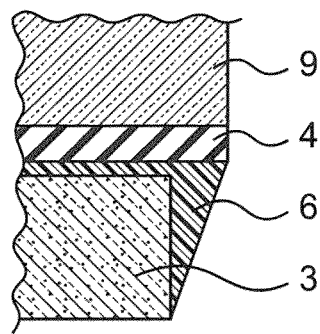
FIG. 5C is an exemplary enlarged partial cross-sectional view showing the example of the light emitting device in the second embodiment of the invention.

FIGS. 5A, 5B, and 5C are exemplary diagrams showing one example of the structure of the light emitting device B manufactured by using a manufacturing method of a light emitting device according to this embodiment. FIG. 5A shows an upper view of the light emitting device. FIG. 5B is a cross-sectional view taken along line X-X' of FIG. 5A. FIG. 5C is an enlarged cross-sectional view of an end of the bonding layer in FIG. 5B. The light emitting device B includes the substrate 2, the light emitting element 3 flip-chip mounted over the substrate 2 via the conductive members 10, the phosphor layer 4 disposed over the upper surface of the light emitting element 3 via an adhesive layer 6, a translucent member 9 integrally disposed with the phosphor layer 4 over the upper surface of the phosphor layer 4, and the reflective resin 8 disposed along the side surfaces of the light emitting element 3, the phosphor layer 4, and the translucent member 9. The semiconductor element 5 is disposed adjacent to the light emitting element 3.

In the light emitting device B, the phosphor layer 4 is integrally formed with the translucent member 9, and the translucent member 9 serves as a supporter for the phosphor layer 4. Thus, the thinner phosphor layer 4 having a high concentration of phosphor material can be formed over the surface of the translucent member 9. With this arrangement, even though the concentration of phosphor material is high, the thermal conductivity of the phosphor layer 4 can be improved without reducing the mechanical strength of the phosphor layer 4. The plane area of each of the translucent member and the phosphor layer can be the same as that of the upper surface of the light emitting element. Taking into consideration the mounting accuracy in the actual manufacturing step, when the plane area of each of the translucent member and the phosphor layer is the same as that of the upper surface of the light emitting element, the phosphor layer might not be disposed above a part of the upper surface of the light emitting element. In order to surely dispose the phosphor layer over the entire upper surface of the light emitting element, the plane area of each of the translucent member and the phosphor layer is sometimes set larger than that of the upper surface of the light emitting element. In this case, the translucent member supports the entire phosphor layer. When the phosphor layer positioned over the entire main surface of the translucent member is disposed over the upper surface of the light emitting element, an outer periphery of the phosphor layer located outside the edge of the upper surface of the light emitting element can also be stably supported without partly being peeled or broken.

(Substrate)

Material for the substrate 2 for use can be the same as that used in the first embodiment.

(Light Emitting Element)

The light emitting element 3 for use can be the same as that used in the first embodiment.

(Phosphor Layer)

The phosphor layer 4 absorbs at least a part of light emitted from the light emitting element 3 to generate light having a different wavelength. The phosphor layer 4 can be formed by molding a mixture of a translucent material containing resin, glass, inorganic material, or the like with a binder made of phosphor. The phosphor layer 4 may be formed in a single layer of one kind of material or two or more kinds of materials, or may be formed of a laminated layer with two or more layers. A diffusing agent may be added to the phosphor layer 4 if necessary. The phosphor layer 4 is preferably formed to have a larger area than the area of the upper surface of the light emitting element 3. In this case, the phosphor layer 4 is disposed at the light emitting element 3 such that an exposed part of the phosphor layer 4 not covered by the upper surface of the light emitting element is formed as a part of the bonding surface of the phosphor layer with the light emitting element.

The phosphor layer 4 is printed on the surface of a translucent member mentioned below. The phosphor layer of this embodiment is in direct contact with the surface of the translucent member, but is not limited thereto. Alternatively, the phosphor layer may be bonded via another member, such as an adhesive. For example, the bonding ways can include pressure bonding, fusion bonding, sintering, bonding with an organic adhesive, bonding with an inorganic adhesive, such as a low-melting point glass, and the like. Formation methods of the phosphor layer can include printing, compression molding, phosphor electrodeposition, phosphor sheet, and the like. The printing process involves preparing a paste containing a phosphor, a binder, and a solvent, applying the paste to the surface of the translucent member, and then drying the paste to form the phosphor layer. The binders for use can include organic resin binder, such as epoxy resin, silicone resin, phenol resin, and polyimide resin, and inorganic binder, such as glass. The compression molding involves molding a material for the phosphor layer containing a phosphor material in a binder, on the surface of a translucent member by use of a mold. The phosphor electrodeposition involves forming a conductive thin film that can be translucent, on the surface of the translucent member, and depositing a charged phosphor layer on the thin film by electrophoresis. The phosphor sheet process involves mixing a phosphor material into a silicon resin, processing the mixture into a sheet-like phosphor, and press-bonding and integrating the thin phosphor sheet of about 100 μm or less in thickness with a translucent member for the purpose of improving the heat dissipation property of heat from the phosphor. The phosphor sheet has any thickness as long as it is sufficiently thin.

The thickness of the phosphor layer 4 is in a range of 20 to 100 μm, and preferably 20 to 50 μm. When the phosphor layer 4 has a thickness of more than 100 μm, the heat dissipation property of the phosphor layer tends to be reduced. As the phosphor layer is thinned, the heat dissipation property is preferably improved. However, the excessive thin phosphor layer contains a very small amount of phosphor material, which tends to reduce a range of chromaticity of the emitted light of interest. Taking into consideration that aspect, the thickness of the phosphor layer 4 can be adjusted to an appropriate value.

A typical phosphor that can emit a white mixed-colored light beam in appropriate combination with the use of a blue light emitting element is, for example, an yttrium aluminum garnet phosphor (YAG phosphor). In use of the light emitting device that can emit white light, the concentration of the phosphor contained in the phosphor layer 4 is adjusted so as to emit the white light. The concentration of the phosphor is in a range of, for example, about 5 to 50%.

Alternatively, a blue light emitting element is used as the light emitting element 3, and a YAG phosphor and a nitride phosphor containing a predominant amount of a red component are used as the phosphor, which can emit umber light. Most of the phosphor emitting the umber light has a low light-conversion efficiency. In order to obtain the desired color tone, the concentration of the phosphor is desired to be increased. Such a phosphor generates more heat than other phosphors, which is a big problem. This embodiment can increase the concentration of the phosphor material of the phosphor layer and can decrease the thickness of the phosphor layer. Thus, this embodiment can appropriately use the phosphor emitting the umber light.

The YAG phosphor and the nitride phosphor for use can be the same as those used in the first embodiment.

(Translucent Member)

The translucent member 9 is a member separately provided from the phosphor layer containing the phosphor material. The translucent member 9 is a supporter for supporting the phosphor layer formed at its surface. The translucent member 9 for use can be a plate-like member made of translucent material, such as glass or resin. Glasses can be selected from borosilicate glass, and quartz glass. Resin can be selected from silicone resin and epoxy resin. The translucent member 9 may have any thickness as long as the translucent member can impart the sufficient mechanical strength to the phosphor layer 4 without reducing the mechanical strength during the manufacturing process. The excessive thickness of the translucent member 9 fails to reduce the size of the light emitting device or reduces the heat dissipation property. Thus, the translucent member 9 should have an appropriate thickness. The main surface of the translucent member is preferably larger than the size of the contour of the light emitting element. This is because, by providing the phosphor layer over the entire main surface of the translucent member, the phosphor layer can be surely disposed over the entire upper surface of the light emitting element in disposing the translucent member with the phosphor layer over the upper surface of the light emitting element, even with a little deviation of mounting accuracy. The diffusing agent may be contained in the translucent member 9. When the concentration of phosphor material of the phosphor layer 4 is increased, color unevenness tends to be caused. However, the presence of the diffusing agent can suppress the unevenness of not only color but also brightness. The diffusing agent for use can be made of titanium oxide, barium titanate, aluminum oxide, silicon dioxide, and the like. The upper surface of the translucent member 9 serving as the light emitting surface is not limited to a flat surface, and may have fine asperities. The fine asperities on the surface can promote scattering of the light emitted from the light emitting surface to thereby suppress the unevenness of brightness or color.

(Adhesive Layer)

The adhesive layer 6 intervenes in between the light emitting element 3 and the phosphor layer 4 to fix the light emitting element 3 to the phosphor layer 4. The adhesive forming the adhesive layer 6 is preferably made of material that can effectively guide the light emitted from the light emitting element 3 toward the phosphor layer 4, while optically coupling the light emitting element 3 to the phosphor layer 4. Specifically, suitable materials for the adhesive layer 6 can include organic resin, such as epoxy resin, silicon resin, phenol resin, or polyimide resin, and preferably silicone resin. As the thickness of the adhesive layer is decreased, the adhesive layer exhibits its function more effectively. This is because the thinner adhesive layer improves its heat dissipation property, and reduces the loss of light passing through the adhesive layer to improve the light output from the light emitting device.

Preferably, the adhesive layer 6 exists not only between the light emitting element 3 and the phosphor layer 4, but at the side surfaces of the light emitting element 3. The bonding layer on the side surface reflects the light emitted from the side surface of the light emitting element 3 to allow the light to enter the phosphor layer 4, thereby improving the light-conversion efficiency of the phosphor. As shown in FIG. 5C, preferably, in the vertical cross-sectional view of the side surface of the light emitting element 3, the adhesive extends at a corner formed by the side surface of the light emitting element 3 and the surface on the light emitting element side surface of the phosphor layer 4. The extending adhesive layer preferably has a roughly triangular cross section such that the thickness of the adhesive layer is decreased toward the lower part of the light emitting element 3. A part of the reflective resin is preferably disposed to be in contact with the adhesive layer having the roughly triangular cross section. Thus, the light emitted from the side surface of the light emitting element 3 is reflected by an interface between the reflective resin and the adhesive layer having the roughly triangular cross section. If the area of the phosphor layer is increased to be larger than that of the upper surface of the light emitting element, the outer periphery of the phosphor layer 4 hangs out of the upper surface of the light emitting element and the adhesive layer having the roughly triangular cross section makes the reflected light from the side surface of the light emitting element 3 tend to enter the outer periphery of the phosphor layer 4, which can improve the light emission brightness of the light emitting device. Such a hanging out part of the adhesive layer can also be formed by adjusting the amount of an adhesive for bonding the translucent member with the phosphor layer on its main surface, to the upper surface of the light emitting element, so as to cause the excessive adhesive whose amount is more than that required for bonding to the upper surface of the light emitting element to hang out to the light emitting element side surface. Alternatively, by adjusting the amount of binder of the phosphor layer disposed at the translucent member, the phosphor layer with the binder half-cured is pressed against the upper surface of the light emitting element to cause a part of the binder to extend over the side surfaces of the light emitting element, which can form the hanging out part of the adhesive. The shape of the hanging out part of the adhesive layer can be formed to an optimum shape for reflecting the light emitted from the side surface of the light emitting element 3 by optimizing the wettability or viscosity of the silicon resin to the side surface of the light emitting element or the surface of the phosphor layer.

In use of the silicone resin in the binder of the phosphor layer 4, the adhesive of the adhesive layer 6 can also preferably use the silicon resin. This arrangement can decrease a difference in refractive index between the phosphor layer 4 and the adhesive layer 6, which can increase the amount of incident light from the adhesive layer 6 to the phosphor layer 4.

(Semiconductor Element)

The semiconductor elements 5 are disposed adjacent to the light emitting elements 3 over the substrate 2, separately from the light emitting elements 3. Such semiconductor elements 5 can be the same as that used in the first embodiment.

The height of the semiconductor element in mounting is preferably lower than that of the combination of the light emitting element, the phosphor layer, and the translucent member. This is because the use of the contour of the semiconductor element can increase the uppermost surface of the reflective resin, thereby suppressing the sink of the resin.

(Reflective Resin)

The reflective resin for use in this embodiment can be the same as that used in the first embodiment.

(Conductive Member)

The conductive member 10 for use can be bumps. Suitable materials for the bumps can include, Au, or an alloy of Au. Especially, suitable materials for other conductive members can include eutectic solder (Au—Sn), Pb—Sn, lead-free solder, and the like. Although FIGS. 5A, 5B, and 5C show an example of use of the conductive member 10 as the bump, the conductive member 10 is not limited to the bump, and for example, may be a conductive paste.

(Underfill Material)

The underfill material for use in this embodiment can be the same as that used in the first embodiment.

(Manufacturing Method)

Figure 6A:
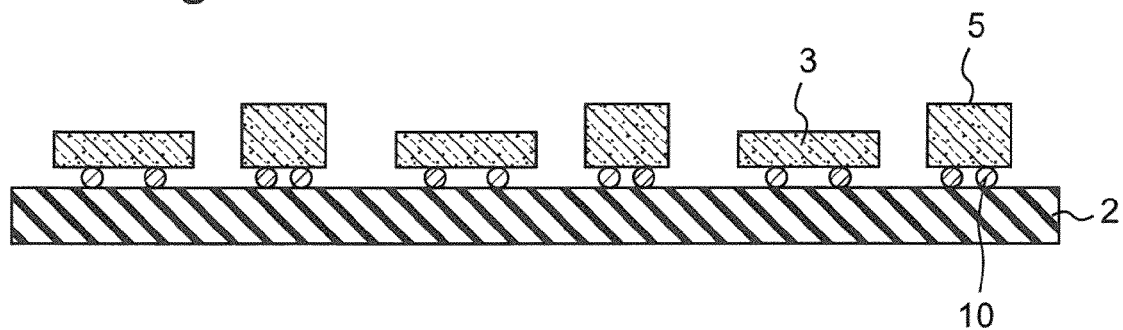
FIG. 6A is a schematic cross-sectional view showing an example of one step in a manufacturing method according to the second embodiment of the invention.
Figure 6B:
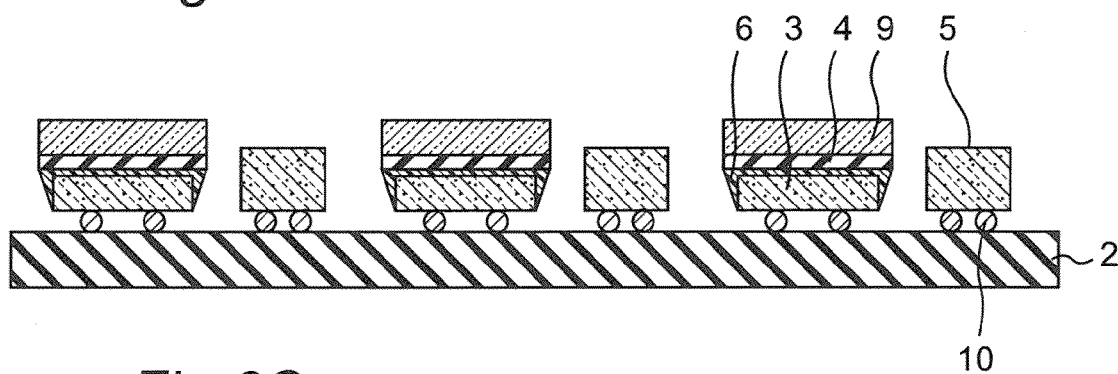
FIG. 6B is a schematic cross-sectional view showing an example of another step in the manufacturing method in the second embodiment of the invention.
Figure 6C:
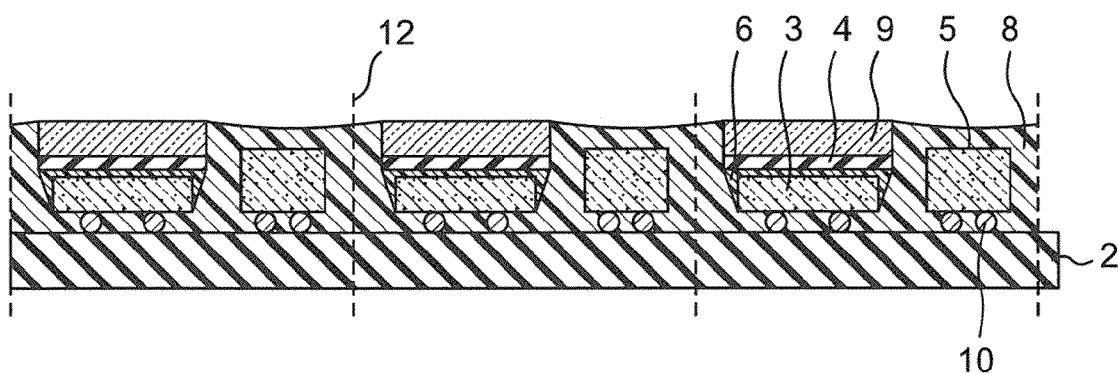
FIG. 6C is a schematic cross-sectional view showing an example of another step in the manufacturing method in the second embodiment of the invention.

A manufacturing method of the light emitting device in this embodiment differs from the first embodiment in that a step of disposing the reflective resin involves disposing the translucent member with the phosphor layer previously formed on its surface, over the upper surface of the light emitting element with the phosphor layer facing toward the upper surface of the light emitting element. FIGS. 6A, 6B, and 6C show exemplary diagrams of an example of steps in the manufacturing method of the light emitting device in this embodiment. FIG. 6A shows the step of disposing the light emitting elements 3 on the aggregate substrate. The semiconductor element 5 is disposed between the adjacent light emitting elements in one of the column and row directions of the arranged light emitting elements 3. Methods for arranging the light emitting elements 3 and the semiconductor elements 5 for use can include flip-chip mounting. Conductive patterns including a positive electrode and a negative electrode insulated from each other are formed over the substrate 2. In mounting, the bumps may be provided on the substrate, or on the light emitting element 3 and the semiconductor element 5.

Both the p and n electrodes (not shown) of the light emitting element 3 are respectively opposed and fixed to both the positive and negative electrodes (not shown) formed on the same surface of the substrate 2 via the conductive members 10. The respective electrodes of the light emitting element 3 are opposed to the conductive members 10 by applying heat, ultrasound wave, and loads, so that the light emitting elements 3 and the conductive members 10 are coupled to the conductive pattern on the substrate.

FIG. 6B shows the step of disposing the translucent member with the phosphor layer previously formed on its surface, over each light emitting element with the phosphor layer side surface facing the upper surface of the light emitting element. The phosphor layer 4 and the translucent member 9 integrally formed via the adhesive layer 6 is disposed over the upper surface of the light emitting element 3. The adhesive layer 6 bonds the phosphor layer 4 to the light emitting element 3. The phosphor layer 4 is formed to be larger than the area of the upper surface of the light emitting element 3. The phosphor layer 4 is coupled to the light emitting element 3 while having its part exposed from and not covered by the upper surface of the light emitting element. In disposing the phosphor layer 4 over the upper surface of the light emitting element 3, the adhesive hanging out of the upper surface of the light emitting element 3 is attached to the side surfaces of the light emitting element 3 and the exposed part of the phosphor layer to thereby form the handing out part of the adhesive layer on the side surfaces of the light emitting element 3. The adhesive layer on the side surfaces of the light emitting element 3 has a roughly triangular cross section whose thickness is decreased toward the lower part of the light emitting element 3 in the vertical cross-sectional view. The light emitted from the side surfaces of the light emitting element 3 is reflected from the adhesive layer on the side surfaces thereof at an angle in a wide range, which allows the light to easily enter the outer periphery of the phosphor layer 4 to thereby improve the brightness of the light emitting device. In the manufacturing process, the adhesive before bonding can be applied to the phosphor layer side surface of the translucent member, or can also be applied to the upper surface of the light emitting element. At that time, a part of the adhesive preferably extends to the edge formed by the side surface of the light emitting element and the surface on the light emitting element side of the phosphor layer. Parts of the adhesive layer handing out to the side surfaces of the light emitting element form the triangular cross-sectional shape.

FIG. 6C shows the step of disposing the reflective resin. The reflective resin 8 is disposed along the side surfaces of the light emitting elements 3 and the side surfaces of the phosphor layers 4 and translucent members 9. The reflective resin 8 is to reflect light emitted from the light emitting element 3, and disposed over the side surfaces of the light emitting elements 3, and the side surfaces of the phosphor layers 4 and translucent members 9 to cover the entire semiconductor elements 5.

The semiconductor element 5 is disposed in the intermediate region between the adjacent light emitting elements 3, which results in raising the reflective resin 8 by the size of the contour of the semiconductor element 5 to suppress the sink of the reflective resin 8. Thus, in forming the light emitting devices by dividing along the cutting lines 12, the width of the reflective layer on the side surface of each phosphor layer 4 becomes thick as compared to the case without the semiconductor element 5. As a result, the light from the phosphor layer 4 can be sufficiently reflected, which effectively improve the light-extraction efficiency. The underfill material (not shown) may be charged into gaps between the light emitting element 3 and semiconductor element 5, and the conductive member 10 and the substrate 2.

Then, the reflective resin 8 and substrate 2 are cut along the cutting lines 12 shown in FIG. 6C so as to include at least one light emitting element 3 and one semiconductor element 5 to thereby separate the group of light emitting devices formed over one substrate 2 into the individual light emitting devices.

This embodiment has the following effects in addition to the effects obtained by the first embodiment. That is, the phosphor layer is integrally formed with the translucent member, and the translucent member serves as the supporter of the phosphor layer, whereby the concentration of the phosphor material can be increased without increasing the thickness of the phosphor layer. With this arrangement, the thermal conductivity of the phosphor layer can be improved without decreasing the mechanical strength of the phosphor layer.

Third Embodiment

Figure 7:
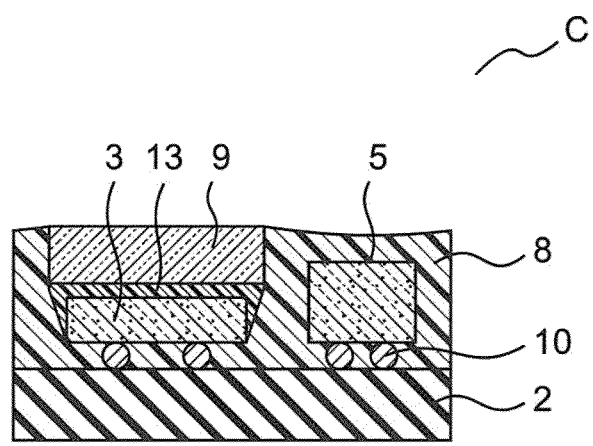
FIG. 7 is a schematic cross-sectional view showing another example of the light emitting device according to a third embodiment of the invention.

FIG. 7 is a schematic cross-sectional view showing the structure of a light emitting device C in this embodiment. The light emitting device C has the same structure as that of the light emitting device of the second embodiment except that the adhesive layer of the second embodiment does not exist in the third embodiment, that a phosphor layer 13 contains a thermosetting binder, and that the phosphor layer 13 is fixed directly to the light emitting element 3.

Figure 8A:
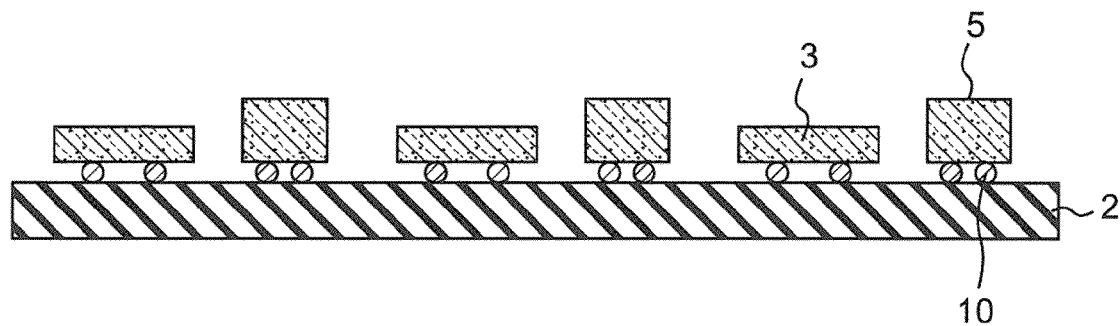
FIG. 8A is a schematic cross-sectional view showing an example of one step in a manufacturing method according to the third embodiment of the invention.
Figure 8B:
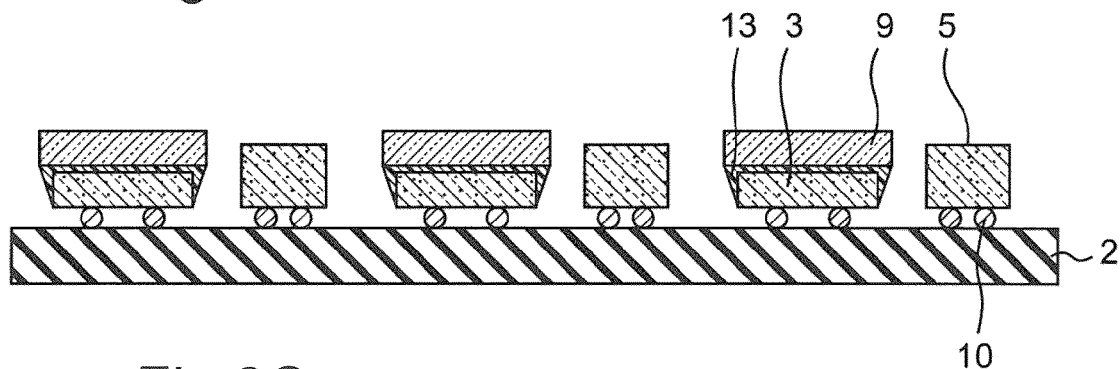
FIG. 8B is a schematic cross-sectional view showing an example of another step in the manufacturing method in the third embodiment of the invention.
Figure 8C:
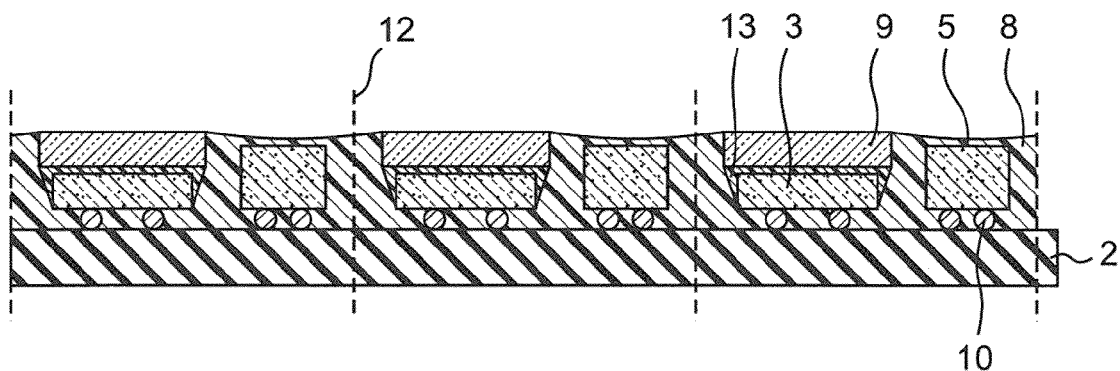
FIG. 8C is a schematic cross-sectional view showing an example of another step in the manufacturing method in the third embodiment of the invention.

FIGS. 8A, 8B, and 8C are exemplary diagrams showing one example of steps of a manufacturing method of the light emitting device C in this embodiment. The manufacturing method of this embodiment can manufacture the light emitting device in the same way as that of the second embodiment except that the phosphor layer containing thermosetting binder is fixed directly to the light emitting element 3 without forming the adhesive layer.

FIG. 8A shows the step of disposing the light emitting elements over the substrate. The light emitting elements 3 are arranged over the aggregate substrate. FIG. 8B shows a step of disposing the translucent members with the phosphor disposed on its surface, over the respective light emitting elements. The phosphor layer 13 and the translucent 9 integrally formed are arranged over the upper surface of the light emitting element 3. FIG. 8C shows a step of disposing the reflective resin. The reflective resin 8 is disposed along the side surfaces of the light emitting elements 3 and the side surfaces of the phosphor layers 4 and translucent members 9.

The phosphor layer 13 contains the phosphor material and the thermosetting binder. The thermosetting binder is in a half-cured state with a viscosity at the time when the phosphor layer is formed over the surface of the translucent member. After disposing the phosphor layer over the upper surface of the light emitting element, the binder is heated and fully cured. The thermosetting binder that can be used for this embodiment can be, for example, silicone resin.

This embodiment uses a part of the phosphor layer 13 as only an adhesive layer of the second embodiment, but has the same effects as in the second embodiment, and does not require the adhesive layer, which can produce the light emitting devices at low cost. The light emitted from the light emitting element directly enters the phosphor layer, which can improve the light-conversion efficiency.

EXAMPLES

The present invention will be described in detail below by way of Examples, but is not limited to the following Examples.

Example 1

Manufacture of Light Emitting Device

In Example 1, the light emitting device shown in FIGS. 3A and 3B was manufactured by the method shown in FIGS. 1A, 1B, and 2. In manufacturing, the following processes were performed on an aggregate substrate, and finally the substrate was singulated into individual light emitting devices.

First, the substrate 2 with conductive patterns formed on its front surface was provided. In this example, a plate-like aluminum nitride substrate was used as the substrate 2. The substrate 2 was produced by calcining an aluminum nitride plate material having a thermal conductivity of about 170 W/mK, and forming the conductive pattern made of metal, such as Cu, Ni, or Au, over the aluminum nitride plate for establishing electric connection with the light emitting element. Each substrate had longitudinal and lateral lengths shown in FIGS. 3A and 3B of about 1.8 mm and about 1.45 mm, respectively, and a thickness of about 0.4 mm. The conductive pattern had a thickness of about 2 μm.

Then, the light emitting element 3 and the semiconductor element 5 were put on the substrate. That is, a plurality of light emitting elements are arranged in a matrix on an aggregate substrate, and each semiconductor element was disposed between the adjacent light emitting elements in one direction of the column and row directions of the light emitting devices arranged in the matrix. Specifically, the light emitting element 3 was formed by stacking semiconductor layers over a sapphire substrate. Each light emitting element 3 had a substantially planar shape of about 1.0 mm square and a thickness of about 0.11 mm. Then, the semiconductor elements were arranged in columns and flip-chip mounted using bump made of Au with the sapphire substrate side positioned as the light emission surface. Further, the semiconductor elements 5 previously provided with bumps made of Au were flip-chip mounted on the conductive patterns.

In this example, as shown in FIG. 2, the semiconductor element was disposed between the adjacent light emitting elements in the row direction having a larger distance between the adjacent light emitting elements because a distance x (0.75 mm) between the adjacent light emitting elements in the row direction was larger than a distance y (0.38 mm) between the adjacent light emitting elements in the column direction.

Then, the phosphor layer 4 was bonded to the upper surface of each light emitting element 3. In this example, a silicone resin was used as the adhesive material 6, and cured by heat, so that the phosphor layer 4 was bonded to the sapphire substrate of the light emitting element 3 via a bonding surface. The phosphor layer 4 in this example was a phosphor plate of about 0.2 mm in thickness consisting of glass with YAG dispersed thereinto. The area of the lower surface of the phosphor layer 4 was larger than that of the upper surface of the light emitting element 3, and the phosphor layer 4 was bonded to have an exposed surface from the bonding surface.

Then, the reflective resin 8 was charged into the surroundings of the light emitting elements 3, the phosphor layers 4, and the semiconductor elements 5. Specifically, the reflective resin 8 was disposed along the side surfaces of the light emitting elements 3 and the phosphor layer 4 to completely embed the semiconductor elements 5 in the reflective film 8. In this example, the reflective resin 8 used contained about 30% by weight of titanium oxide particles in a dimethyl silicone resin. In this way, the reflective resin is charged into the gap between the adjacent light emitting elements, and can be substantially positioned on the side surfaces of the light emitting elements, which eliminates the necessity of disposing, for example, a dum along the side surface of the light emitting element for the purpose of positioning the reflective resin having adequate flexibility before being cured.

Then, the substrate 2 subjected to the above-mentioned steps was accommodated in and heated by a heating furnace, so that the reflective resin 8 was cured. Then, the substrate and the reflective resin were cut along the cutting line 12 to include the light emitting element 3 and the semiconductor element 5 which were adjacent to each other to separate the individual light emitting devices from a group of the light emitting devices. That is, as shown in FIGS. 1B and 2, the cutting lines 12 were set between the adjacent light emitting elements 3 in the row direction of the matrix arrangement and between the light emitting element 3 and the adjacent semiconductor element 5 in the column direction of the matrix arrangement on the cut substrate to include at least one light emitting element 3 and one semiconductor element 5. Then, both the reflective resin 8 and the aggregate substrate were cut along the cutting line 12.

Figure 9A:
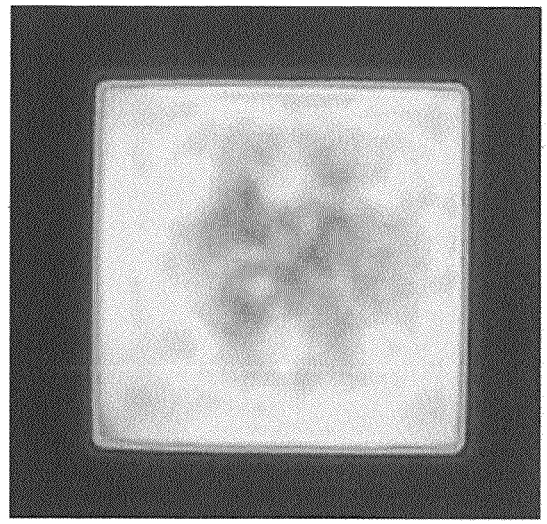
FIG. 9A is a photograph showing the state of a light emitting surface of Example 1.

The state of light emission on the light emitting surface is represented by a photograph shown in FIG. 9A when driving the thus-obtained light emitting device at 900 mA. The light emitting surface had a high surface brightness and uniform brightness distribution, whereby four side surfaces of the light emitting surface were clearly observed.

Figure 10:
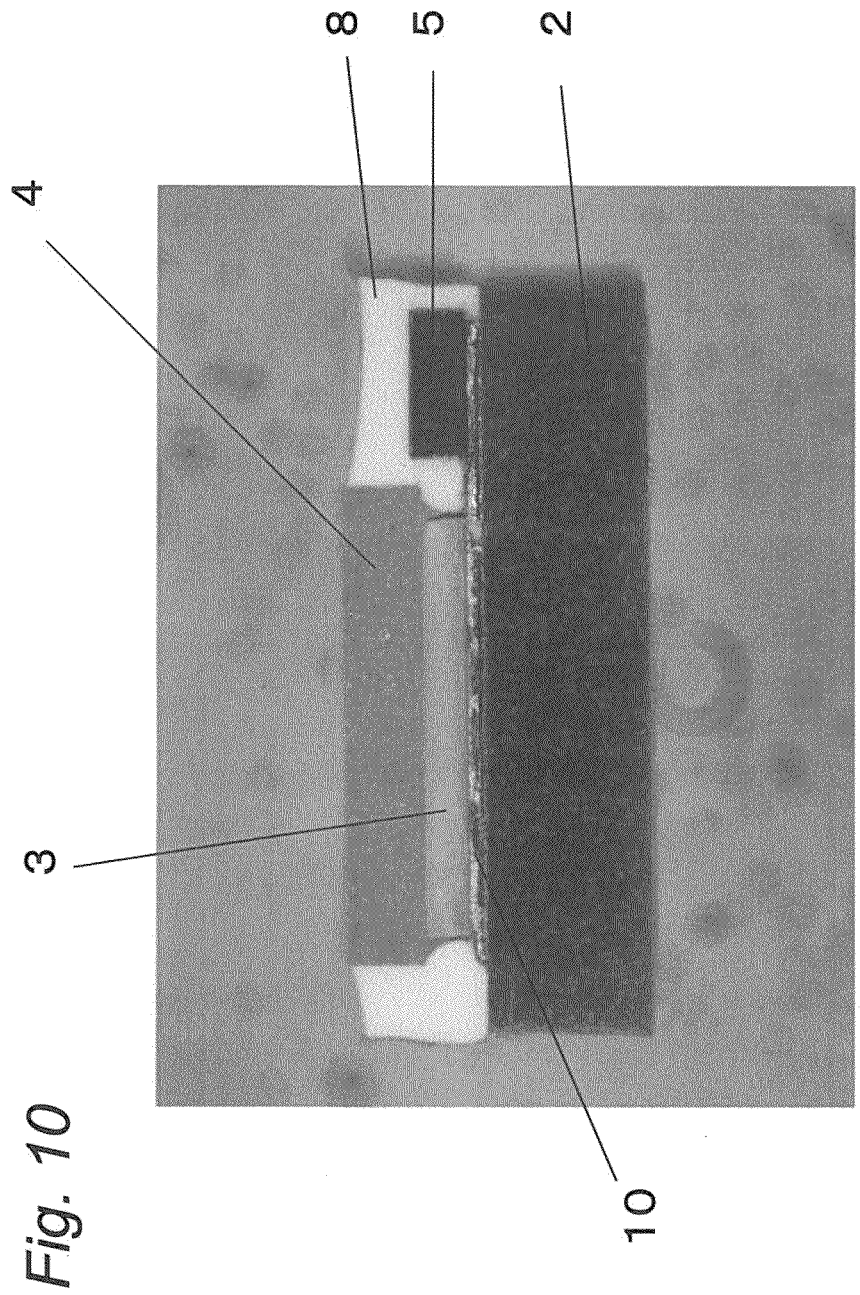
FIG. 10 is a cross-sectional photograph showing the state of the light emitting surface of Example 1.
Figure 11:
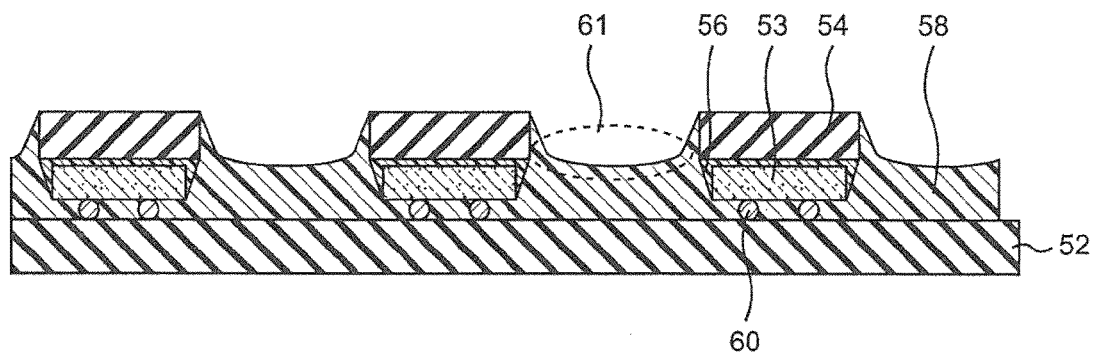
FIG. 11 is an exemplary cross-sectional photograph showing one step of a conventional manufacturing method.

The photographs of the cross-section of the thus-obtained light emitting device is shown in FIG. 10. As can be seen from the photograph, the sink of the reflective resin (white part) is largely suppressed. Further, the corner formed by the reflective resin side surface on the semiconductor element side and the upper surface of the reflective resin forms an acute angle (81.57°) in the vertical cross-sectional view including the light emitting element and the semiconductor element. Also, the corner formed by the reflective resin side surface on the light element side and the upper surface of the reflective resin forms an obtuse angle (106.93°) in the vertical cross-sectional view including the light emitting element and the semiconductor element.

Comparative Example 1

Figure 9B:
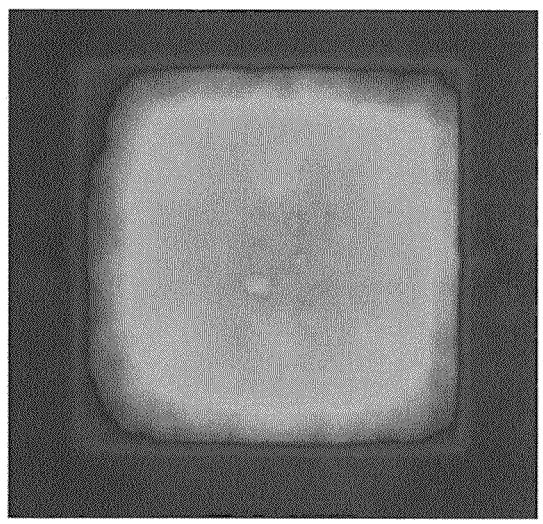
FIG. 9B is a photograph showing the state of a light emitting surface of Comparative Example 1.

In the same way as in Example 1, except that the semiconductor element was not disposed over the substrate, a light emitting device was manufactured. The light emission state of the light emitting surface is shown in the photograph of FIG. 9B. The light emitting surface had a low surface brightness and non-uniform brightness distribution (especially, its end being dark), whereby the outlines of four side surfaces of the light emitting surface were vague.

Example 2

Manufacture of Light Emitting Device

In Example 2, the light emitting device shown in FIGS. 5A, 5B, and 5C was manufactured by the method shown in FIGS. 6A, 6B, and 6C. In manufacturing, the following processes were performed on an aggregate substrate, and finally the substrate was singulated into individual light emitting devices.

In the same way as in Example 1, the substrate 2 with conductive patterns formed on its front surface was provided.

Then, in the same way as in Example 1, the light emitting element 3 and the semiconductor element 5 were put on the substrate.

Apart from the above-mentioned steps, the phosphor layer 4 was applied to the surface of the translucent member 9, that is, one entire main surface thereof by printing. A plate-shaped molded member made of borosilicate glass was used as the material for the translucent member 9. Each translucent member had a substantially square planar shape of about 1.15 mm square, and was larger by about 0.15 mm in each of the longitudinal and lateral sizes than the planar size of the light emitting element. The translucent member had a thickness of about 0.15 mm. The translucent member with the phosphor layer 4 formed thereat was formed by printing a mixture of two kinds of phosphor materials of (Sr,Ca)AlSiN$_3$:Eu, and Y$_{2.965}$Ce$_{0.035}$(Al$_{0.8}$Ga$_{0.2}$)$_5$O$_{12}$ with a silicone resin as a binder, onto one main surface of the plate-shaped translucent member, and cutting the translucent member with the phosphor layer into an appropriate size. The concentration of the combination of the two phosphor materials in the phosphor layer 4 was 90% by weight. The phosphor layer facing the upper surface of the light emitting element had a substantial square planar shape of about 1.15 mm square, like the planar shape of the translucent member, and a thickness of 90 μm.

Then, a silicone resin was disposed as the adhesive on the upper surface of the light emitting element 3, whereby the phosphor layer 4 formed at the translucent member was bonded to the upper surface of the sapphire substrate of the light emitting element 3. The area of the surface of the phosphor layer 4 on the light emitting element side surface was larger than that of the upper surface of the light emitting element 3, and the phosphor layer 4 was bonded to have an exposed surface from the bonding surface.

Then, the reflective resin 8 was charged into the surroundings of the light emitting elements 3, the phosphor layers 4, the phosphor layers 9, and the semiconductor elements 5. Specifically, the reflective resin 8 was disposed along the side surfaces of the light emitting elements 3, phosphor layers 4, and translucent members 9 to completely embed the semiconductor elements 5 in the reflective film 8. In this example, the reflective resin 8 used contained about 30% by weight of titanium oxide particles in a dimethyl silicone resin.

Then, the substrate 2 subjected to the above-mentioned steps was accommodated in and heated by a heating furnace, so that the reflective resin 8 was cured. Then, the substrate and the reflective resin were cut along the cutting line 12 to include the light emitting element 3 and the semiconductor element 5 which were adjacent to each other to separate a group of the light emitting devices into the individual light emitting devices.

When the thus-obtained light emitting device was driven at 900 mA, the light emitting surface had a high surface brightness and uniform brightness distribution.

The methods for manufacturing a light emitting device of the present invention can be applied to manufacture light emitting devices that can be used for a display device, an illumination tool, a display, a backlight source of a liquid crystal display, and the like.

What is claimed is:

1. A method for manufacturing a light emitting device, the light emitting device comprising a light emitting element disposed over a substrate, and a reflective resin disposed along a side surface of the light emitting element, the method comprising the steps of:

disposing a plurality of light emitting elements in a matrix over an aggregate substrate, and disposing a semiconductor element other than the light emitting element in between the adjacent light emitting elements in one direction of column and row directions of the light emitting elements disposed in the matrix;

after disposing phosphor layers over the respective upper surfaces of the light emitting elements, disposing a reflective resin along the side surfaces of the light emitting elements and the side surfaces of the phosphor layers to cover the semiconductor elements; and simultaneously cutting the reflective resin and the substrate disposed in between the adjacent light emitting elements in one of the column and row directions and between the light emitting element and the semiconductor element adjacent thereto in the other direction of the column and row directions so as to include at least one light emitting element and one semiconductor element, wherein, in the step of cutting, cutting is performed in a vertical direction including the light emitting element and the semiconductor element such that a corner formed by a side surface of the reflective resin on the semiconductor element side and an upper surface of the reflective resin forms an acute angle in a cross-sectional view.

2. The method for manufacturing a light emitting device according to claim 1, wherein the semiconductor element is disposed between the light emitting element and another adjacent light emitting element having a larger one of a distance between the adjacent light emitting elements in one direction of the column and row directions and another distance between the adjacent light emitting elements in the other direction of the column and row directions.

3. The method for manufacturing a light emitting device according to claim 1, wherein in the step of cutting, cutting is performed such that another corner formed by a side surface of the reflective resin on the light emitting element side and the upper surface of the reflective resin forms an obtuse angle in the cross-sectional view.

4. The method for manufacturing a light emitting device according to claim 1, wherein a deepest part of a recessed portion formed at the upper surface of the reflective resin is formed directly above the semiconductor element.

5. The method for manufacturing a light emitting device according to claim 4, wherein the deepest part of the recessed portion formed at the upper surface of the reflective resin is formed directly above a center of the upper surface of the semiconductor element.

6. The method for manufacturing a light emitting device according to claim 1, wherein an adhesive layer is formed such that, in the vertical cross-sectional view of the side surface of the light emitting element, the adhesive layer extends at a corner formed by the side surface of the light emitting element and the surface on the light emitting element side of surface of the phosphor layer, and such that the adhesive layer has a roughly triangular cross section so that the thickness of the adhesive layer is decreased toward the lower part of the light emitting element.

* * * * *